(12) United States Patent
Liu et al.

(10) Patent No.: US 7,472,743 B2
(45) Date of Patent: *Jan. 6, 2009

(54) LIQUID COOLING SYSTEM SUITABLE FOR REMOVING HEAT FROM ELECTRONIC COMPONENTS

(75) Inventors: Tay-Jian Liu, Guangdong (CN); Chih-Peng Lee, Guangdong (CN)

(73) Assignee: Foxconn Technology Co., Ltd., Tu-Cheng City, Taipei Hsien (TW)

( * ) Notice: Subject to any disclaimer, the term of this patent is extended or adjusted under 35 U.S.C. 154(b) by 82 days.

This patent is subject to a terminal disclaimer.

(21) Appl. No.: 11/308,375

(22) Filed: Mar. 20, 2006

(65) Prior Publication Data
US 2006/0249278 A1 Nov. 9, 2006

(30) Foreign Application Priority Data
May 7, 2005 (CN) .................... 2005 1 0034565

(51) Int. Cl.
*H05K 7/20* (2006.01)
(52) U.S. Cl. ............. 165/80.4; 165/122; 165/104.33; 361/699
(58) Field of Classification Search ............. 165/80.4, 165/104.33, 122; 257/714; 361/699
See application file for complete search history.

(56) References Cited

U.S. PATENT DOCUMENTS

| 6,029,742 | A * | 2/2000 | Burward-Hoy | 165/80.4 |
|---|---|---|---|---|
| 6,263,957 | B1 * | 7/2001 | Chen et al. | 165/80.4 |
| 6,668,911 | B2 * | 12/2003 | Bingler | 165/80.4 |
| 6,894,899 | B2 * | 5/2005 | Wu et al. | 361/699 |
| 6,990,816 | B1 * | 1/2006 | Zuo et al. | 62/3.7 |
| 7,013,959 | B2 * | 3/2006 | Lee et al. | 165/104.33 |
| 7,114,551 | B2 * | 10/2006 | Matsushita et al. | 165/80.4 |
| 7,156,160 | B2 * | 1/2007 | Lee et al. | 165/104.33 |
| 7,222,661 | B2 * | 5/2007 | Wei et al. | 165/80.4 |
| 2003/0201095 | A1 | 10/2003 | Liu | |
| 2004/0070949 | A1 * | 4/2004 | Oikawa et al. | 165/104.33 |
| 2004/0246677 | A1 * | 12/2004 | Chen | 361/697 |
| 2005/0183848 | A1 * | 8/2005 | Cheng et al. | 165/104.33 |
| 2006/0096743 | A1 * | 5/2006 | Lee et al. | 165/104.33 |
| 2006/0185829 | A1 * | 8/2006 | Duan et al. | 165/104.33 |
| 2006/0185830 | A1 * | 8/2006 | Duan | 165/104.33 |
| 2007/0012427 | A1 * | 1/2007 | Liu et al. | 165/104.33 |

FOREIGN PATENT DOCUMENTS

| CN | 2622866 Y | 6/2004 |
|---|---|---|
| CN | 1585120 A | 2/2005 |
| TW | 545871 | 8/2003 |
| TW | 590273 | 5/2004 |
| TW | M252257 | 12/2004 |

* cited by examiner

Primary Examiner—Leonard R Leo
(74) Attorney, Agent, or Firm—Winston Hsu

(57) ABSTRACT

A liquid cooling system (100) for removing heat from a heat-generating component is disclosed. The liquid cooling system includes a heat-absorbing member (20), a heat-dissipating member (30), a pump (50) and a mounting mechanism (10, 60). The heat-absorbing member defines therein a fluid flow channel (26) for passage of a coolant. The pump is in fluid communication with the heat-absorbing member and the heat-dissipating member for driving the coolant to circulate between the heat-absorbing member and the heat-dissipating member. The mounting mechanism includes a bottom portion (10) and a top portion (60) cooperating with the bottom portion to define therebetween a receiving space. The heat-absorbing member, heat-dissipating member and pump are received in the receiving space and are mounted to the mounting mechanism.

10 Claims, 10 Drawing Sheets

LIQUID COOLING SYSTEM SUITABLE FOR REMOVING HEAT FROM ELECTRONIC COMPONENTS

FIELD OF THE INVENTION

The present invention relates generally to an apparatus for dissipation of heat from heat-generating components, and more particularly to a liquid cooling system suitable for removing heat from electronic components of computers.

DESCRIPTION OF RELATED ART

Currently, liquid cooling systems are widely used for removing heat from electronic components such as central process units (CPUs) of computers. A liquid cooling system generally includes a heat-absorbing member, a heat-dissipating member and a pump. These individual components are connected together in series so as to form a heat transfer loop. In practice, the heat-absorbing member is maintained in thermal contact with a heat-generating component (e.g., a CPU) for absorbing the thermal energy generated by the CPU. The liquid cooling system employs a coolant circulating through the heat transfer loop so as to continuously bring the thermal energy absorbed by the heat-absorbing member to the heat-dissipating member where the thermal energy is dissipated. The pump is applied to drive the coolant, after being cooled in the heat-dissipating member, back to the heat-absorbing member.

In the liquid cooling system, the heat-absorbing member, the heat-dissipating member and the pump are connected together generally by a plurality of connecting tubes so as to form the heat transfer loop. Oftentimes, the heat-absorbing member, the heat-dissipating member and the pump are to be located at different locations when mounted to a computer system. In this situation, mounting of the liquid cooling system to the computer system or demounting of the liquid cooling system from the computer system will be a burdensome and time-consuming work since the mounting and demounting of each component of the liquid cooling system must be individually addressed.

Therefore, it is desirable to provide a liquid cooling system which overcomes the foregoing disadvantages.

SUMMARY OF INVENTION

The present invention relates to a liquid cooling system for removing heat from a heat-generating component. The liquid cooling system includes a heat-absorbing member, a heat-dissipating member, a pump and a mounting mechanism. The heat-absorbing member defines therein a fluid flow channel for passage of a coolant. The pump is in fluid communication with the heat-absorbing member and the heat-dissipating member for driving the coolant to circulate between the heat-absorbing member and the heat-dissipating member. The mounting mechanism includes a bottom portion and a top portion cooperating with the bottom portion to define therebetween a receiving space. The heat-absorbing member, heat-dissipating member and pump are received in the receiving space and are mounted to the mounting mechanism. Thus, these individual components of the liquid cooling system are pre-assembled together. The liquid cooling system can then be easily mounted to a specific environment for application.

In one embodiment, the mounting mechanism also functions as an air duct for guiding an airflow produced by a cooling fan disposed adjacent to the heat-dissipating member. A portion of the cooling fan extends beyond and located outside the air duct. Thus, the airflow produced by the cooling fan is divided into two currents capable of being used for cooling different components. Also, the airflow produced by the cooling fan is capable of being further used to cool other heat-generating components after flowing through the heat-dissipating member under the guidance of the air duct.

Other advantages and novel features of the present invention will become more apparent from the following detailed description of preferred embodiment when taken in conjunction with the accompanying drawings, in which:

DETAILED DESCRIPTION

Figure 1:
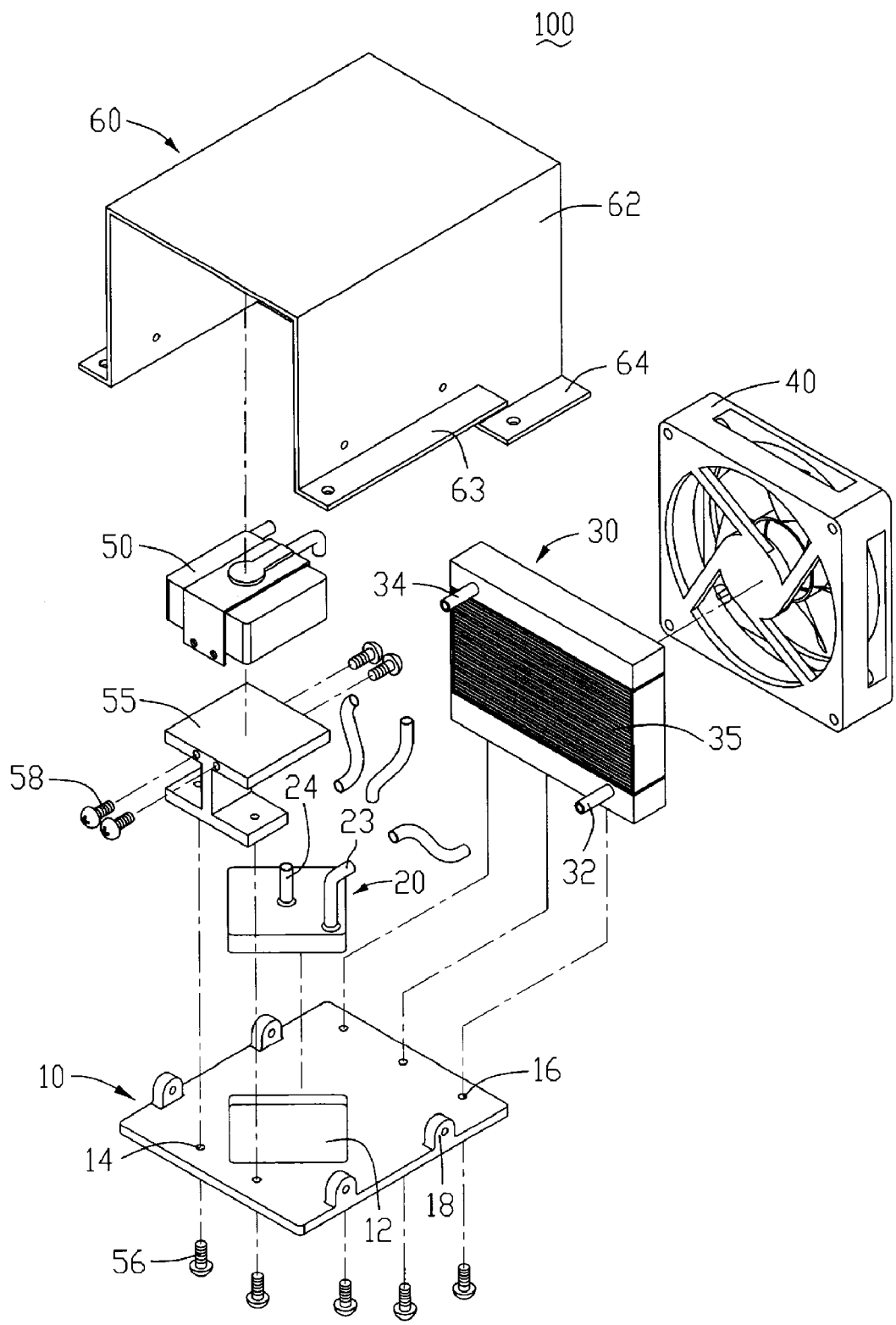
FIG. 1 is an exploded, isometric view of a liquid cooling system in accordance with one embodiment of the present invention.

FIG. 1 illustrates a liquid cooling system 100 in accordance with one embodiment of the present invention. The liquid cooling system 100 includes a bottom plate 10, a heat-absorbing member 20, a heat-dissipating member 30, a cooling fan 40, a pump 50 and a top cover 60. The heat-absorbing member 20, the heat-dissipating member 30 and the pump 50 are connected together in series via a plurality of connecting tubes (not labeled) so as to form a heat transfer loop. A coolant such as water is filled into the heat-absorbing member 20 and is circulated through the heat transfer loop under the drive of the pump 50.

The bottom plate 10 has a plate-type rectangular configuration and defines a through hole 12 in a central portion thereof for receiving and securing the heat-absorbing member 20. Also, the bottom plate 10 defines a plurality of mounting holes 14, 16 at two opposite sides thereof, wherein the mounting holes 14 located at one of the opposite sides are used for securing the pump 50 and the mounting holes 16 located at the other of the opposite sides are used for securing the heat-dissipating member 30. The bottom plate 10 has a pair of spaced protrusions 18 extending from each of the other two opposite sides thereof for use in mounting the top cover 60 to the bottom plate 10.

Figure 2:
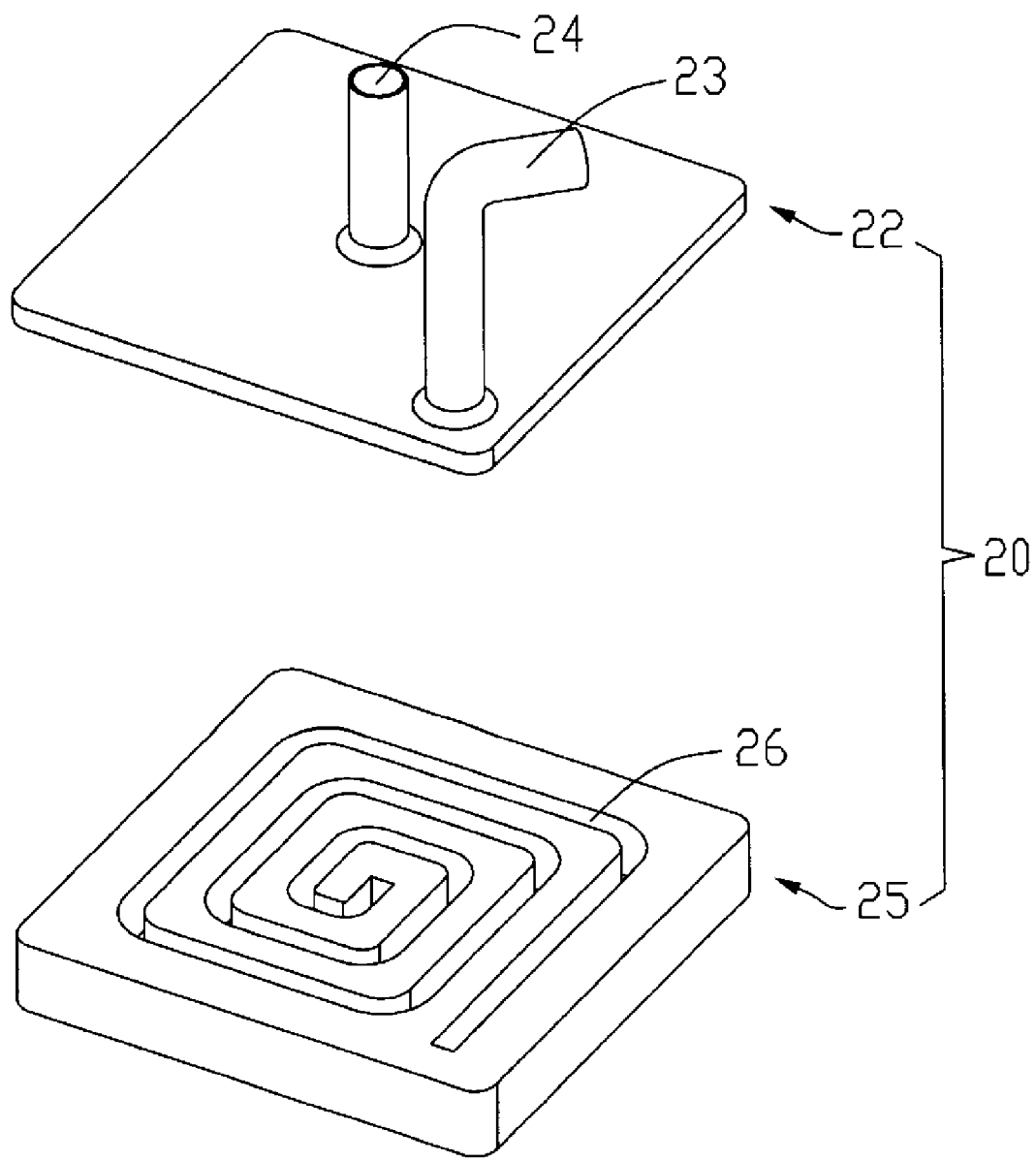
FIG. 2 is an exploded, isometric view of a heat-absorbing member of the liquid cooling system of FIG. 1.

With reference also to FIG. 2, the heat-absorbing member 20 includes an upper portion 22 and a lower portion 25. The upper portion 22 is hermetically connected to the lower portion 25 by, for example, a soldering process. The heat-absorbing member 20 has an inlet tube 24 and an outlet tube 23, both of which are connected to the upper portion 22 of the heat-absorbing member 20, with the inlet tube 24 being located at a central portion of the upper portion 22 and the outlet tube 23 being located a corner thereof. The lower portion 25 of the heat-absorbing member 20 defines therein a fluid flow channel 26 for passage of the coolant. The fluid flow channel 26 has a spiral configuration with a center coincident with a central portion of the heat-absorbing member 20. Although the fluid flow channel 26 is illustrated as formed at the lower portion 25 of the heat-absorbing member 20, it should be recognized that the fluid flow channel 26 may also be formed at the upper portion 22 of the heat-absorbing member 20 or formed at both of the upper and lower portions 22, 25 of the heat-absorbing member 20. The inlet tube 24 and the outlet tube 23 are respectively in fluid communication with two ends (i.e., an inner end and an outer end) of the fluid flow channel 26, respectively, so that the coolant is capable of entering into the heat-absorbing member 20 via the inlet tube 24 and escaping the heat-absorbing member 20 via the outlet tube 23.

Figure 3:
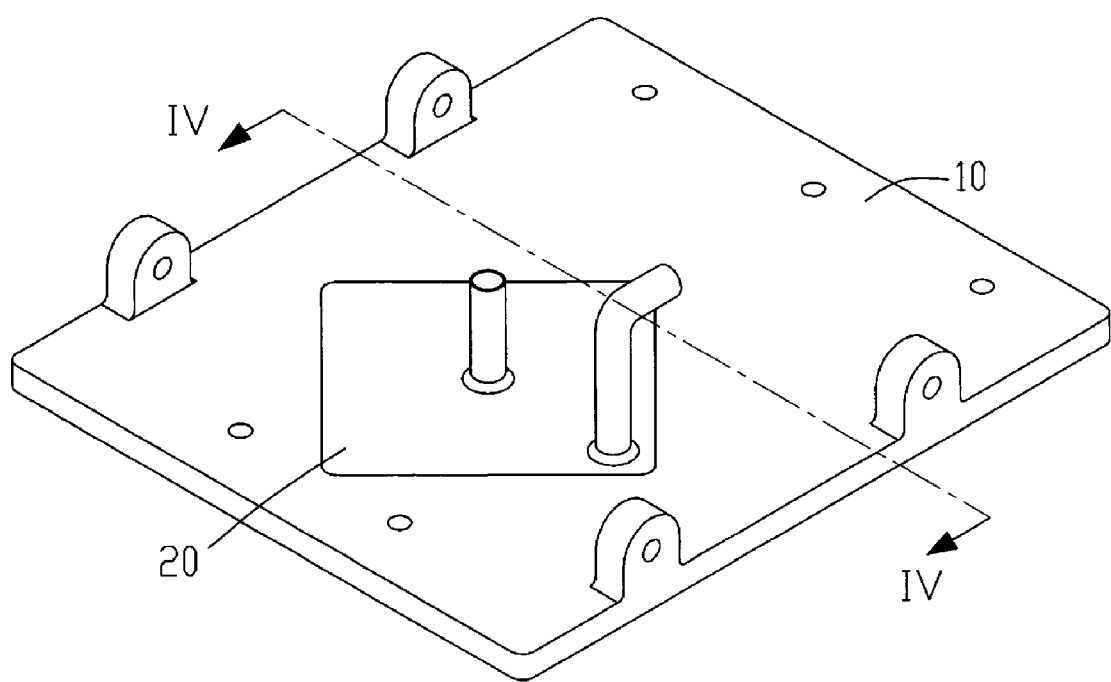
FIG. 3 is an assembled, isometric view of the heat-absorbing member and a bottom plate of the liquid cooling system of FIG. 1.
Figure 4:
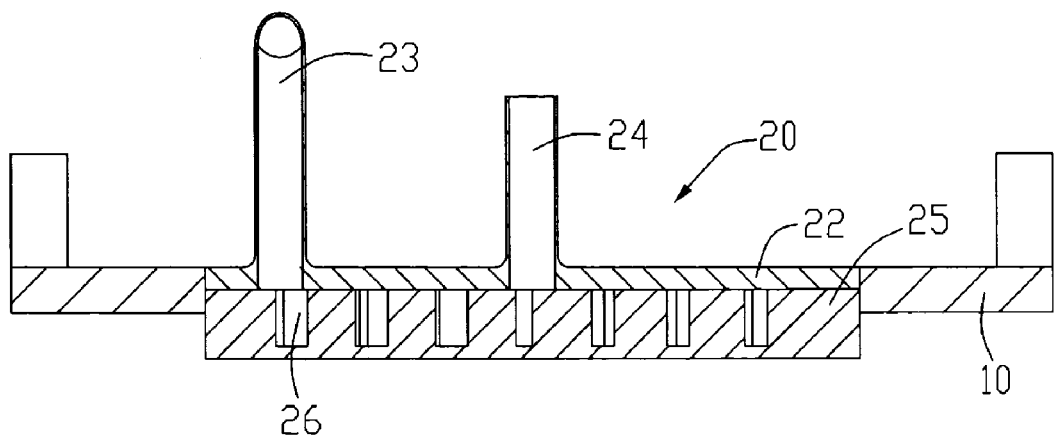
FIG. 4 is a cross-sectional view of the assembly of FIG. 3, taken along line IV-IV thereof.

Referring also to FIGS. 3-4, the heat-absorbing member 20 is mounted to the bottom plate 10 in the through hole 12 by, for example, a soldering process. The heat-absorbing member 20 has a thickness larger than that of the bottom plate 10 so that, when the heat-absorbing member 20 is combined to the bottom plate 10, a bottom portion of the heat-absorbing member 20 extends beyond an underside of the bottom plate 10 in order for contacting a heat-generating component.

As shown in FIG. 1, the heat-dissipating member 30 includes a plurality of metal fins 35 and defines therein also a fluid flow channel (not shown) being in fluid communication with the fluid flow channel 26 of the heat-absorbing member 20. Similarly, the heat-dissipating member 30 has an inlet tube 32 and an outlet tube 34 communicating with two ends of the fluid flow channel of the heat-dissipating member 30, respectively. The cooling fan 40 has a footprint larger than that of the heat-dissipating member 30. The top cover 60 has an inverted U-shaped configuration, which includes a top plate (not labeled) and a pair of sidewalls 62 depending from the top plate. A pair of flanges 63, 64 extend outwardly from a bottom edge of each of the sidewalls 62. The flanges 63, 64 occupy different sections of the bottom edge, with one flange 63 being located in front of and above the other flange 64.

Figure 5:
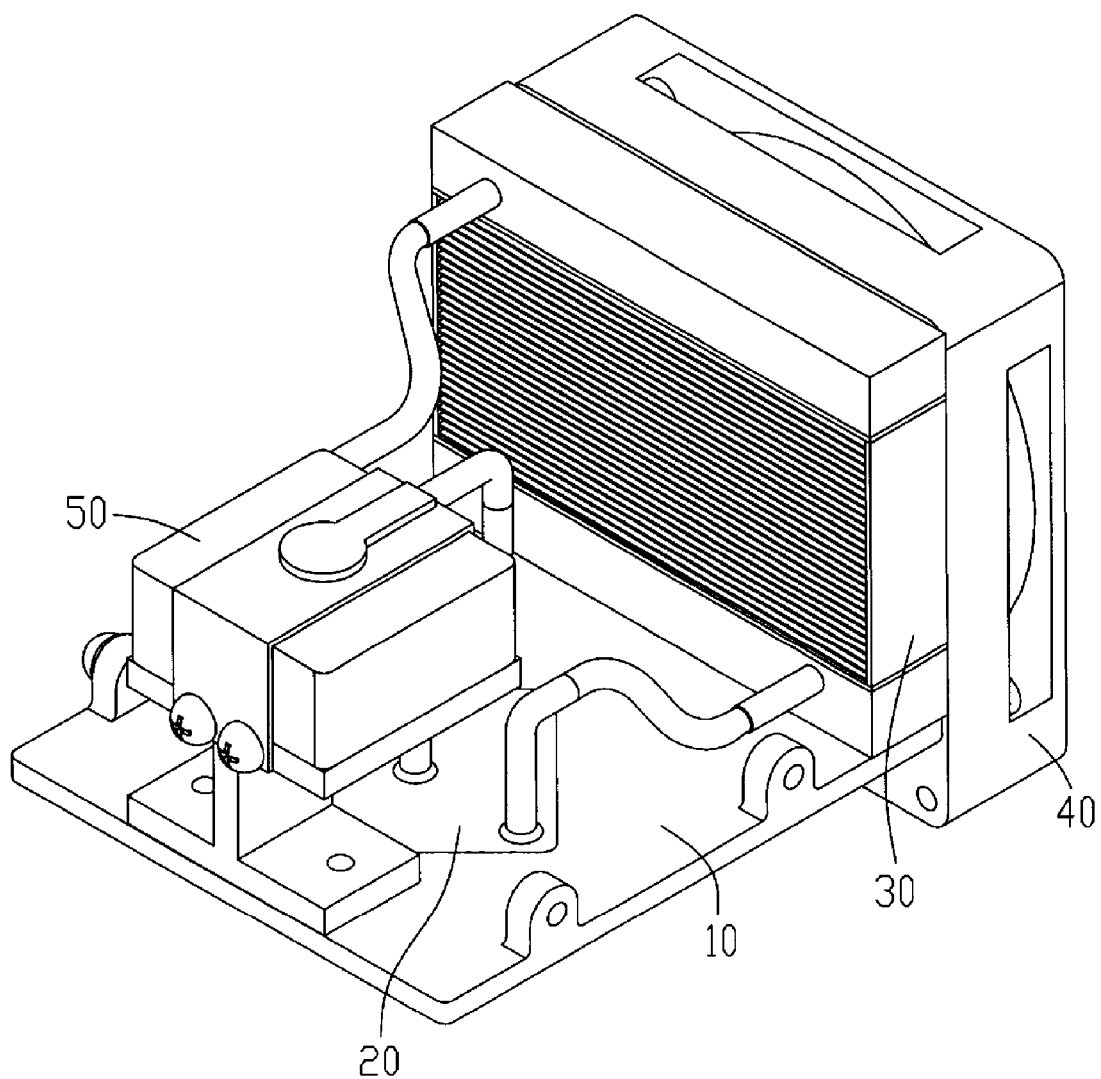
FIG. 5 is a partially assembled, isometric view of the liquid cooling system of FIG. 1.
Figure 6:
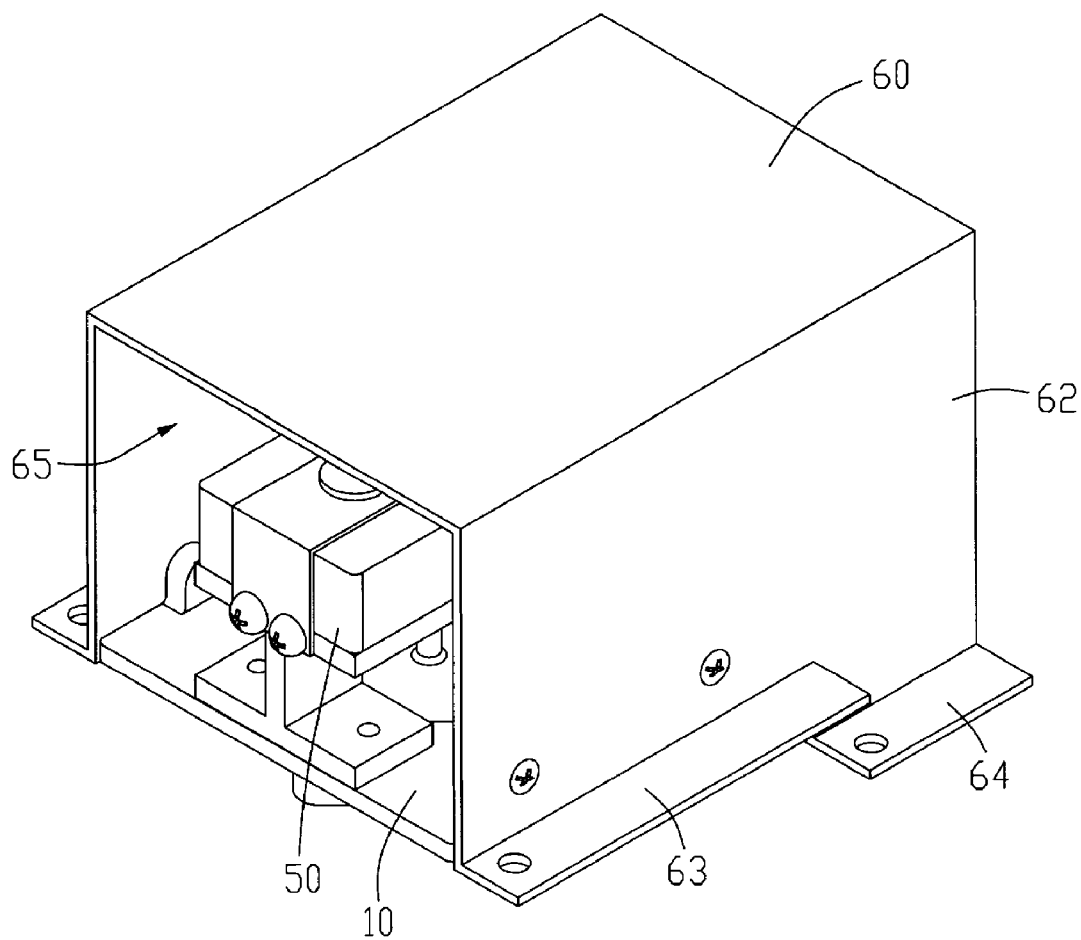
FIG. 6 is a fully assembled, isometric view of the liquid cooling system of FIG. 1.

With reference particularly to FIGS. 1, and 5-6, in assembly, the pump 50 and the heat-dissipating member 30 are mounted to the bottom plate 10 by a plurality of fasteners such as screws 56 extending through the mounting holes 14, 16 defined in the bottom plate 10. Especially, the pump 50 is mounted on a fastening seat 55 which in turn is secured to the bottom plate 10. The cooling fan 40 is disposed adjacent to the heat-dissipating member 30 and a bottom portion of the cooling fan 40 extends beyond and located below the bottom plate 10. Although it is not shown in the drawings, it is well known by those skilled in the art that the cooling fan 40 can be directly mounted to the heat-dissipating member 30 or mounted to a plurality of locking tabs (not shown) extending from the top cover 60. The pump 50 and the cooling fan 40 are arranged at opposite sides of the heat-dissipating member 30. The fastening seat 55 is so dimensioned that, when the pump 50 is mounted on the fastening seat 55, the pump 50 is located at a position aligned with a central portion of the cooling fan 40. It is well known that the central portion of the cooling fan 40 generates a weak airflow due to the existence of a central hub (not labeled) of a fan impeller and a printed circuit board (PCB) (not shown) of the cooling fan 40. With the pump 50 located at that position, the flow resistance generated by the pump 50 to the airflow of the cooling fan 40 is thus minimized.

Then, the heat-absorbing member 20, the heat-dissipating member 30 and the pump 50 are connected together by these connecting tubes. Specifically, the outlet tube 23 of the heat-absorbing member 20 is connected with the inlet tube 32 of the heat-dissipating member 30. The outlet tube 34 of the heat-dissipating member 30 is connected with an inlet tube (not labeled) of the pump 50 and an outlet tube (not labeled) of the pump 50 is connected with the inlet tube 24 of the heat-absorbing member 20. Thus, the pump 50 is in fluid communication with both the heat-absorbing member 20 and the heat-dissipating member 30 so as to drive the coolant to circulate between the heat-absorbing member 20 and the heat-dissipating member 30. The top cover 60 is attached to the bottom plate 10 by a plurality of screws (not labeled) securing the sidewalls 62 thereof to the protrusions 18 of the bottom plate 10. The top cover 60 cooperates with the bottom plate 10 to define therebetween a receiving space 65 for receiving the heat-absorbing member 20, the heat-dissipating member 30 and the pump 50, as shown in FIG. 6. The bottom plate 10 and the top cover 60 function as an air duct for guiding the airflow produced by the cooling fan 40. Accordingly, the air duct has a pair of through openings (not labeled) located at two opposite sides thereof. The airflow produced by the cooling fan 40 is guidable from one of the through openings towards the other of the through openings.

Figure 7:
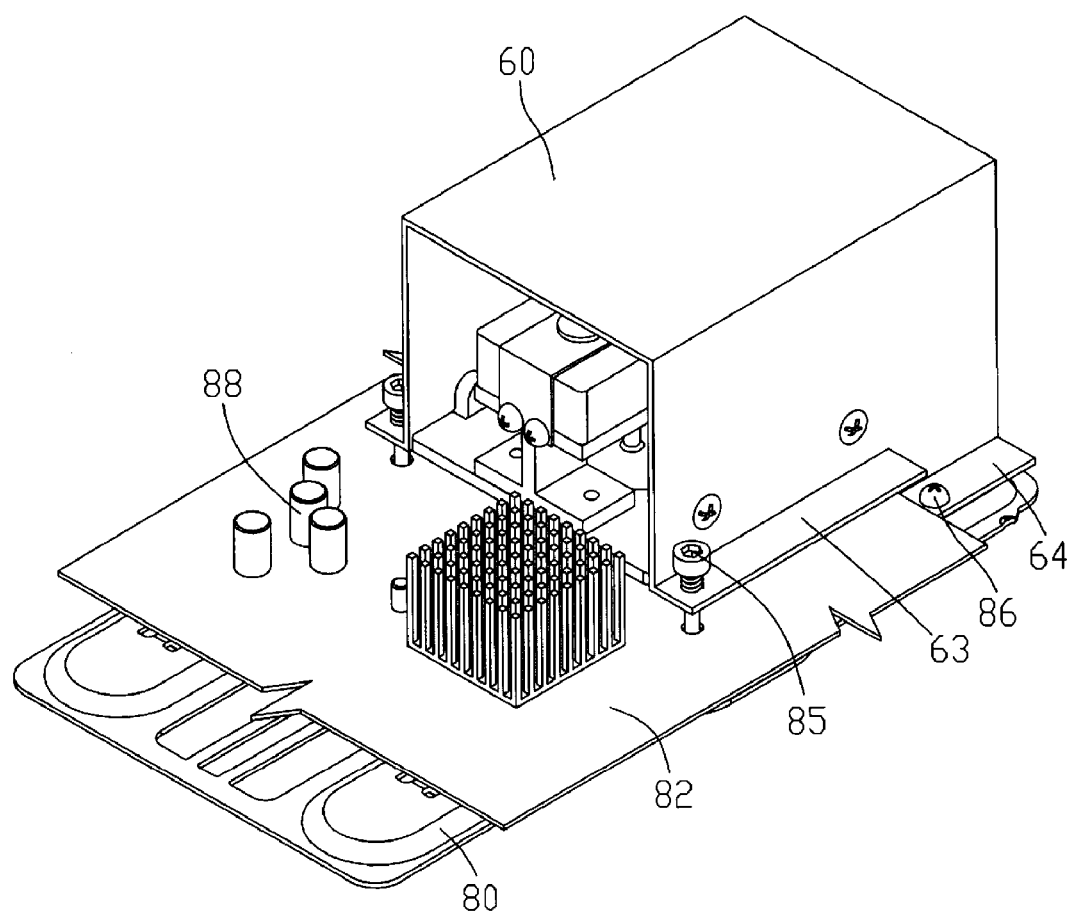
FIG. 7 is similar to FIG. 6, but showing the liquid cooling system being assembled to a computer system.
Figure 8:
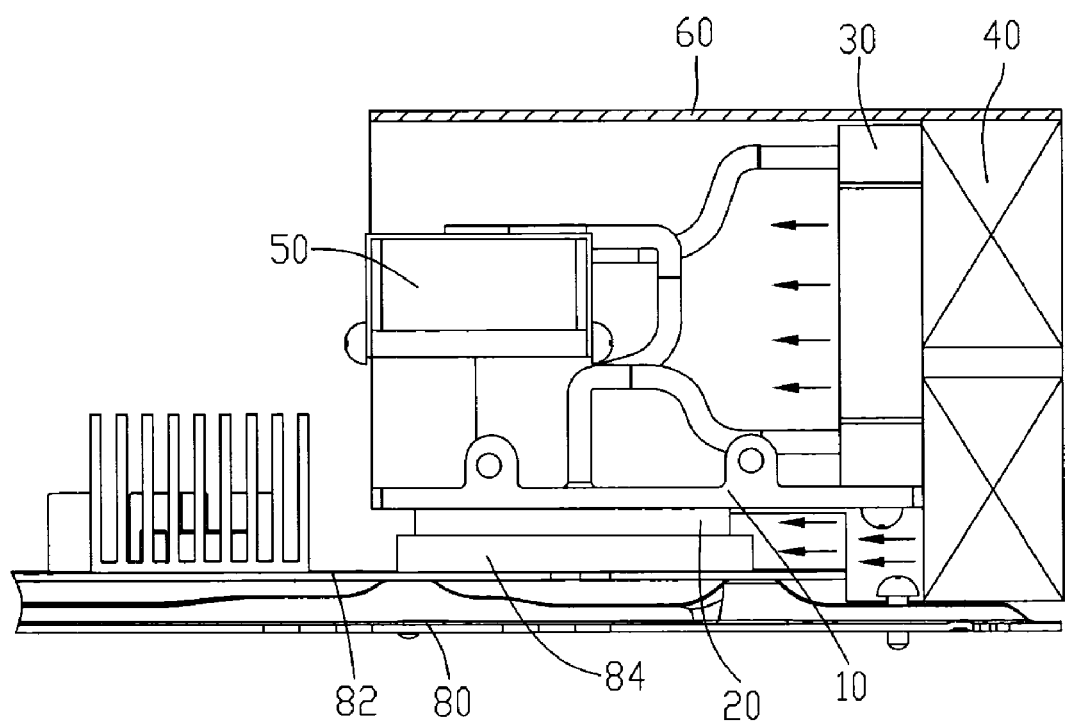
FIG. 8 is a cross-sectional view of the assembly of FIG. 7.

FIGS. 7-8 show that the liquid cooling system 100 is applied for removing heat from a central processing unit (CPU) 84 of a computer system. The computer system includes a system casing 80 and a motherboard 82 mounted on the system casing 80. The CPU 84 is mounted on the motherboard 82. In the drawings, the system casing 80 and the motherboard 82 are partially shown. After individual components of the liquid cooling system 100 are assembled together, the liquid cooling system 100 can then be easily mounted to the CPU 84 by using a plurality of fastener such as screws 85, 86 respectively extending through the flanges 63, 64 of the top cover 60 and engaging with the motherboard 82 or the system casing 80 of the computer system. As a result, the heat-absorbing member 20 is maintained in thermal contact with the CPU 84. The bottom plate 10 is spaced from the motherboard 82 by a specific distance, which is substantially the same as a length of that portion of the cooling fan 40 that extends beyond the bottom plate 10, as particularly shown in FIG. 8. Thus, as the cooling fan 40 rotates, the airflow produced thereby is divided into two currents as indicated by arrows shown in FIG. 8. One current of the airflow flows through the air duct for cooling the heat-dissipating member 30, while the other current of the airflow flows from beneath the bottom plate 10 for cooling the CPU 84, the heat-absorbing member 20 and the bottom plate 10.

In operation, the coolant contained in the heat-absorbing member 20 receives the heat generated by the CPU 84 and then carries the heat to the heat-dissipating member 30 where the heat is dissipated to ambient environment. After releasing the heat, the coolant is brought back to the heat-absorbing member 20 again under the drive of the pump 50, thus continuously taking the heat away from the CPU 84. Furthermore, under the guidance of the air duct, the airflow of the cooling fan 40, after flowing through the heat-dissipating member 30, is still capable of being used to cool other heat-generating electronic components 88 mounted on the motherboard.

Figure 9:
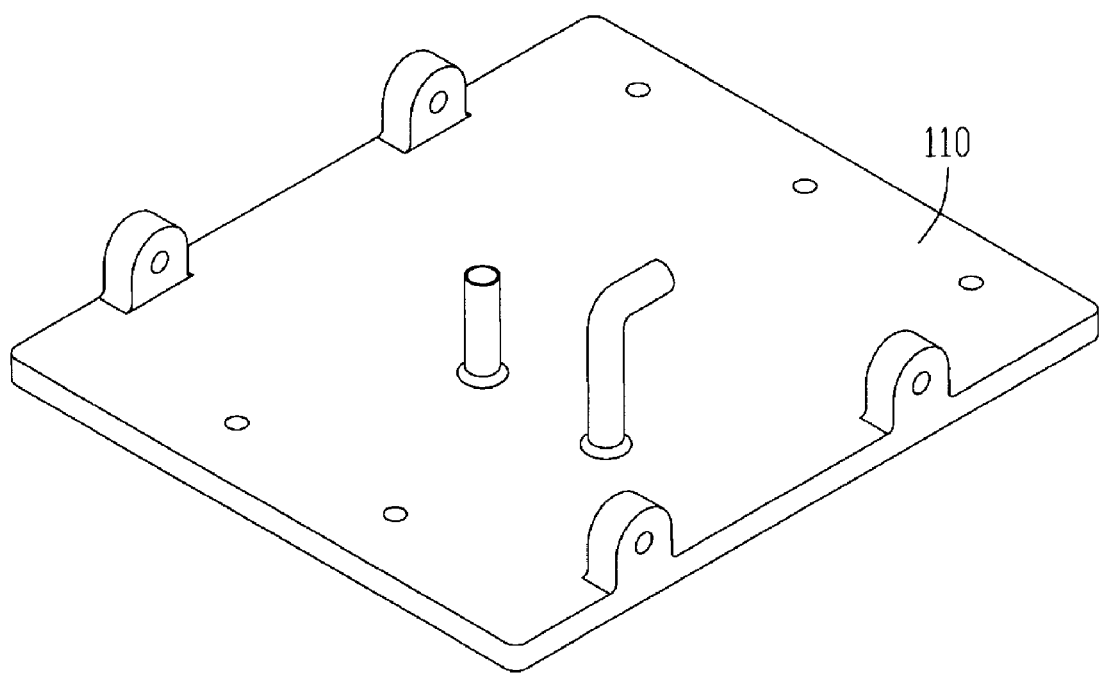
FIG. 9 is an isometric view of a heat-absorbing member in accordance with an alternative embodiment of the present invention.
Figure 10:
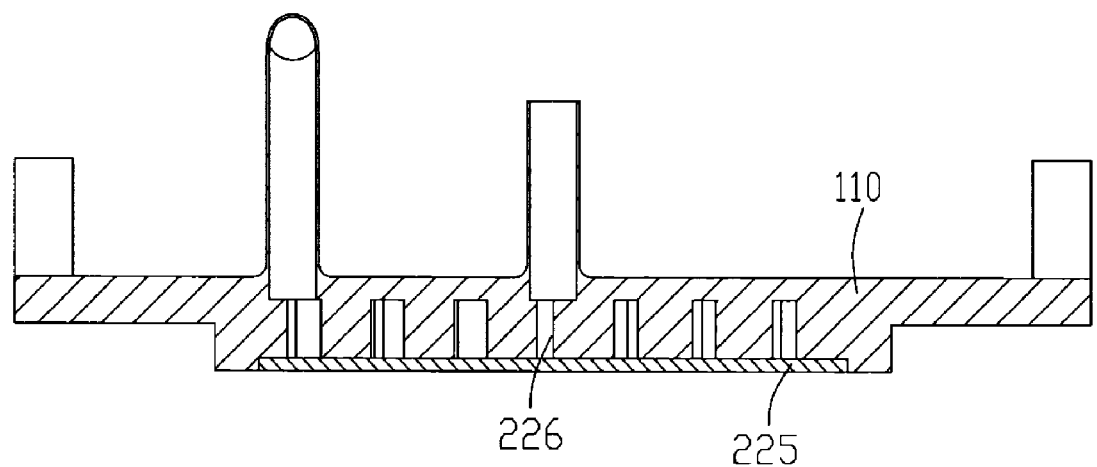
FIG. 10 is a cross-sectional view of the heat-absorbing member of FIG. 9.

In the present liquid cooling system 100, the bottom plate 10 and the upper and lower portions 22, 25 of the heat-absorbing member 20 are typically made of high thermally conductive material such as copper or aluminum. In order to lower down the manufacturing cost, however, the upper portion 22 of the heat-absorbing member 20 can also be made of plastic material, instead of metals. Furthermore, the upper portion 22 or the lower portion 25 of the heat-absorbing member 20 can also be integrally formed with the bottom plate 10. For example, as shown in FIGS. 9-10, the upper portion of the heat-absorbing member is integrally formed with the bottom plate 110, and the fluid flow channel 226 of the heat-absorbing member is defined in the upper portion, instead of being defined in the lower portion 225. In this situation, the bottom plate 110 and the upper portion of the heat-absorbing member are preferably made of plastic material in view of the low manufacturing cost requirement. The lower portion 225 of the heat-absorbing member, however, is still made of high thermally conductive material such as copper or aluminum.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A liquid cooling system comprising:
   a heat-absorbing member defining therein a fluid flow channel for passage of a coolant;
   a heat-dissipating member;
   a pump being in fluid communication with the heat-absorbing member and the heat-dissipating member for driving the coolant to circulate between the heat-absorbing member and the heat-dissipating member;
   an air duct including a bottom portion and a top portion cooperating with the bottom portion to define therebetween a receiving space, said heat-dissipating member and pump being received in the receiving space and are mounted to the air duct, wherein the bottom portion of the air duct has a plate-type configuration and the top portion of the air duct has an inverted U-shaped configuration, and the air duct has a pair of through openings located at two opposite lateral sides thereof, respectively; and
   a cooling fan located adjacent to the heat dissipating member for producing an airflow from one of said through openings towards the other of said through openings;
   wherein the heat-absorbing member includes an upper portion and a lower portion hermetically connected to the upper portion, and the fluid flow channel is defined in one of the upper portion and the lower portion; and
   wherein one of the upper and lower portions of the heat-absorbing member is integrally formed with the bottom portion of the air duct.

2. The liquid cooling system of claim 1, wherein the bottom portion of the air duct is made of plastic material and the upper portion of the heat-absorbing member is integrally formed with the bottom portion of the air duct.

3. The liquid cooling system of claim 1, wherein the pump and the cooling fan are located at opposite sides of the heat-dissipating member.

4. A liquid cooling system comprising:
   a heat-absorbing member;
   a heat-dissipating member;
   a pump for driving a coolant to circulate between the heat-absorbing member and the heat-dissipating member;
   an air duct defining therein a receiving space for accommodating said heat-dissipating member and pump, said heat-absorbing member being mounted to the air duct, the air duct having a pair of through openings located at two opposite sides thereof, respectively; and
   a cooling fan located adjacent to the heat-dissipating member for producing an airflow flowing from one of said through openings towards the other of said through openings, a portion of the cooling fan extending beyond and located outside the air duct.

5. The liquid cooling system of claim 4, wherein the air duct includes a bottom plate and an inverted U-shaped top cover cooperating with the bottom plate to define said receiving space.

6. The liquid cooling system of claim 5, wherein the heat-absorbing member includes an upper portion and a lower portion attached to the upper portion, and the heat-absorbing member is mounted to the bottom plate.

7. The liquid cooling system of claim 5, wherein the heat-absorbing member includes an upper portion and a lower portion attached to the upper portion, and one of the upper portion and the lower portion is integrally formed with the bottom plate.

8. The liquid cooling system of claim 4, wherein the pump and the cooling fan are arranged at opposite sides of the heat-dissipating member, and the pump is located at a position aligned with a central portion of the cooling fan.

9. The liquid cooling system of claim 4, wherein the heat-absorbing member, the heat-dissipating member and the pump are connected together via a plurality of connecting tubes, and the heat-absorbing member defines therein a fluid flow channel for passage of the coolant.

10. The liquid cooling system of claim 9, wherein the fluid flow channel has a spiral configuration with a center coincident with a central portion of the heat-absorbing member, the fluid flow channel having an inner inlet end and an outer outlet end.

* * * * *